United States Patent
Buxton et al.

(10) Patent No.: US 9,910,600 B2
(45) Date of Patent: Mar. 6, 2018

(54) SYSTEM AND METHOD FOR POLLING THE STATUS OF MEMORY DEVICES

(71) Applicant: Toshiba Memory Corporation, Minato-ku, Tokyo (JP)

(72) Inventors: Neil Buxton, Berkshire (GB); Matthew Stephens, Cumbria (GB)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/136,471

(22) Filed: Apr. 22, 2016

(65) Prior Publication Data

US 2016/0259553 A1 Sep. 8, 2016

Related U.S. Application Data

(63) Continuation of application No. 14/195,375, filed on Mar. 3, 2014, now Pat. No. 9,335,952.

(60) Provisional application No. 61/771,432, filed on Mar. 1, 2013.

(51) Int. Cl.
*G06F 3/00* (2006.01)
*G06F 3/06* (2006.01)
*G11C 14/00* (2006.01)

(52) U.S. Cl.
CPC ............ *G06F 3/061* (2013.01); *G06F 3/0653* (2013.01); *G06F 3/0659* (2013.01); *G06F 3/0688* (2013.01); *G11C 14/009* (2013.01); *G11C 14/0081* (2013.01)

(58) Field of Classification Search
CPC ............ G06F 13/28; G06F 12/00; G06F 3/00
USPC ............................................. 710/62; 711/103
See application file for complete search history.

(56) References Cited

U.S. PATENT DOCUMENTS

| | | | | |
|---|---|---|---|---|
| 5,375,222 A | * | 12/1994 | Robinson | G11C 16/102 365/185.33 |
| 6,662,208 B1 | * | 12/2003 | Moeller | H04L 12/2602 370/338 |
| 8,904,082 B1 | * | 12/2014 | Brahmadathan | G06F 13/1647 710/18 |
| 2004/0044898 A1 | * | 3/2004 | Low | G06F 21/72 713/189 |
| 2005/0268025 A1 | * | 12/2005 | Smith | G11C 16/10 711/103 |
| 2009/0089492 A1 | * | 4/2009 | Yoon | G06F 13/1689 711/103 |

(Continued)

*Primary Examiner* — Titus Wong
(74) *Attorney, Agent, or Firm* — White & Case LLP

(57) ABSTRACT

A memory controller and methods thereof suitable for operating a system utilizing multiple memory bus channels and/or multiple banks of memory devices on each channel wherein the memory devices is polled only when necessary. The memory controller includes means for determining a status of each individual memory device of the plurality of memory devices, a channel controller for each memory bus channel, and at least one status register on which is stored a plurality of bits. The channel controller maintains a derived status of each individual memory device based on the current and previous status data. Each individual bit of the plurality of bits of the status register corresponds to an individual memory device of the plurality of memory devices and indicates the derived status of the individual memory device which are used to determine whether to check for a queued command destined for the individual memory device.

23 Claims, 6 Drawing Sheets

(56) References Cited

U.S. PATENT DOCUMENTS

2009/0313422 A1* 12/2009 Lin ................... G06F 12/0246
711/103
2011/0255339 A1* 10/2011 Kim ................... G06F 13/4243
365/185.11

* cited by examiner

SYSTEM AND METHOD FOR POLLING THE STATUS OF MEMORY DEVICES

CROSS REFERENCE TO RELATED APPLICATIONS

This application is a continuation of application Ser. No. 14/195,375, filed Mar. 3, 2014 and claims the benefit of U.S. Provisional Application No. 61/771,432, filed Mar. 1, 2013, the entire contents of each which are incorporated herein by reference.

BACKGROUND OF THE INVENTION

The present invention generally relates to a central processor-based controller for an array of non-volatile memory devices. More particularly, this invention relates to the queuing of commands to the memory devices and the polling of the memory devices in an efficient manner to determine when the memory devices have finished processing the previous command and are ready to accept a subsequent command.

Mass storage devices such as Serial Advanced Technology Attachment (SATA) or Small Computer System Interface (SCSI) interfaced drives are rapidly adopting non-volatile memory technology, such as flash memory components or another emerging solid-state memory technology, including phase change memory (PCM), resistive random access memory (RRAM), magnetoresistive random access memory (MRAM), ferromagnetic random access memory (FRAM), organic memories, or nanotechnology-based storage media such as carbon nanofiber/nanotube-based substrates. Currently the most common solid-state technology uses NAND flash memory components as inexpensive storage memory, often in a form commonly referred to as a solid-state drive (SSD).

NAND flash memory has several advantages over hard disk technology based on spinning magnetic media. Briefly, flash memory devices provide random access read and write capability and access times which are more consistent and much shorter than hard disks, measured in terms of microseconds rather than milliseconds. Even so, a single flash memory device does not have the required bit density in order for an SSD to compete in terms of storage size with a hard disk. Therefore, it becomes desirable for SSDs to incorporate multiple devices in order to increase the available storage size.

Flash memory devices cannot be directly interfaced to a computer processor or storage interface bus and require a separate memory controller device in order to perform certain functions, including functions that are required to compensate for features inherent in SSD technology.

When a single memory controller is required to operate with multiple memory devices, it can do this using a single memory bus which connects to each device in parallel. Individual devices can be separately enabled using an individual chip select signal which allows the devices to operate in parallel without interfering with each other's operation. This means that a command to a device such as erase block (which can take many cycles to execute, but does not require use of the memory bus while executing) can be interleaved with read and program (write) commands to other devices, thereby providing a better throughput of data despite being limited to a single physical bus.

In order to control the access of multiple devices to the same bus, arbitration of access to the bus is required. A state machine can keep track of what commands are outstanding on which devices and can have knowledge of when they will roughly complete and therefore know when the command completion status can be polled and also know when new commands can be issued to other devices in the intervening time while the bus is free. Central to this process is receiving an indication from each device as to when the device is busy internally processing a command, when the device has completed the command (and needs to return status and/or data), and when the device is free to accept another command. For this purpose manufacturers generally provide a physical pin on the memory device to indicate a ready/busy status and/or a read status command which will return the current status.

There is, however, a limit to the number of devices that can use a single bus, as the extra wiring to each new device increases the track lengths from the controller and the increased impedance/capacitance of the wiring subsequently limits the frequency of operation of the bus.

In addition, operating multiple devices in parallel, while providing some improvement, still does not fully solve the problem of lack of storage capacity and providing maximum performance improvement. In order to give even more capacity and performance, devices operating in parallel can be used. With a non-volatile memory storage controller, multiple memory bus lanes or channels are used. Each channel operates independently and in parallel, thereby multiplying the storage capacity and overall input/output performance by the number of channels employed.

This technique can be combined with the attachment of multiple devices in parallel on each channel, where each device is referred to as a bank and an individual device in the array becomes addressable by its channel number and bank number. For example, with eight channels and eight banks on each channel, for a total of sixty-four devices, checking the status can become an onerous task for the controller. In particular, a system which checks the status of each memory bank on a regular basis irrespective of whether commands are being processed on it or whether any commands are queued waiting to be sent to it, will be operating inefficiently as in many cases the status is not required at that time.

What is therefore desired is a method of polling the status of memory banks at a certain time only if the system can make use of that poll status, thereby reducing the time spent polling so as to make the system more efficient.

BRIEF DESCRIPTION OF THE INVENTION

The present invention provides non-volatile memory controllers and methods thereof suitable for operating memory systems utilizing multiple memory bus channels and/or multiple banks of memory devices on each channel, wherein the status of the memory devices is polled only at certain times, for example, when the system can make use of a poll status.

According to one aspect of the invention, a memory controller for a mass storage device comprising a plurality of memory bus channels each connected to a plurality of nonvolatile memory devices includes means for determining a status of each individual memory device of the plurality of memory devices, a channel controller for each memory bus channel, and at least one status register on which is stored a plurality of bits. The determining means provides status data indicating if each individual memory device can accept a data command (ready) or not (busy). The channel controller maintains a derived status of each individual memory device based on the current and previous status data. Each individual bit of the plurality of bits of the status register corresponds to an individual memory device of the plurality of memory devices and indicates the derived status of the individual memory device. The individual bit corresponding to an individual memory device in the at least one status register is used to determine whether to check for a queued command destined for the individual memory device.

According to another aspect of the invention, a method of operating a memory controller for a mass storage device including a plurality of memory bus channels each connected to a plurality of nonvolatile memory devices includes determining a status of each individual memory device of the plurality of memory devices and providing status data indicating if each individual memory device can accept a data command (ready) or not (busy), determining a derived status of each individual memory device based on the current and previous status data of each individual memory device, maintaining the derived status of each individual memory device in a channel controller corresponding to each individual memory bus channel, storing a plurality of bits in at least one status register, each individual bit of the plurality of bits corresponding to an individual memory device of the plurality of memory devices, each individual bit indicating the derived status of the corresponding individual memory device, and determining whether to check for a queued command destined for the individual memory device based on the corresponding individual bit in the at least one status register.

Technical effects of the method and controller described above preferably include the ability to more efficiently perform memory polling by only checking for queued commands when necessary, that is, when the individual memory device is now ready and was previously busy, rather than for every ready memory device.

Other aspects and advantages of this invention will be better appreciated from the following detailed description.

DETAILED DESCRIPTION OF THE INVENTION

Certain commands to a non-volatile memory device can only be issued one at a time. For instance, there are commands which, once they are issued and being processed must complete before a new command can be issued to that device. There are also commands which, once they are issued and being processed, can allow only certain other commands to be issued. New commands may be issued to other devices on the same channel, but if another command arrives for a device that is currently processing a command, it may have to wait and be placed in a FIFO (First In, First Out) queue, waiting for the currently processing command to complete before the next command in the queue can be issued.

The state of the memory device which indicates whether it is currently processing a command is the Ready/Busy# status, which can be either a physical status output pin on the device, or in data returned after issuing a status command. Simply polling the status regularly indicates that a device is ready to accept a new command, but a further check is required to see if a command is queued for that device.

A preferred aspect of the invention is that an extra check can be avoided if it is realized that a command can only be queued if the status is currently Ready and was previously Busy. The reasoning is that if, on the contrary, the previous status was Ready, then the command would have been processed at that time. Consequently, if the current status is Ready and the previous status was Ready, there can be no command queued and it is not necessary for the extra check to be made.

Hence, a preferred aspect of the invention is to provide a more efficient mode of polling that takes the current Ready/Busy status, CRB, and the previous Ready/Busy status, PRB, and combines them to form a Now Ready Previously Busy status, NRPB, according to the following logical equation: NRPB Equals CRB AND NOT PRB. A single test of CQR NOT Equals 1 can be sufficient to know that the device is either not ready to accept a new command or that no command is queued waiting to be processed. Applying such a test, if NRPB Equals 1, then the device is ready to accept a new command which may be queued for that device.

Figure 1:
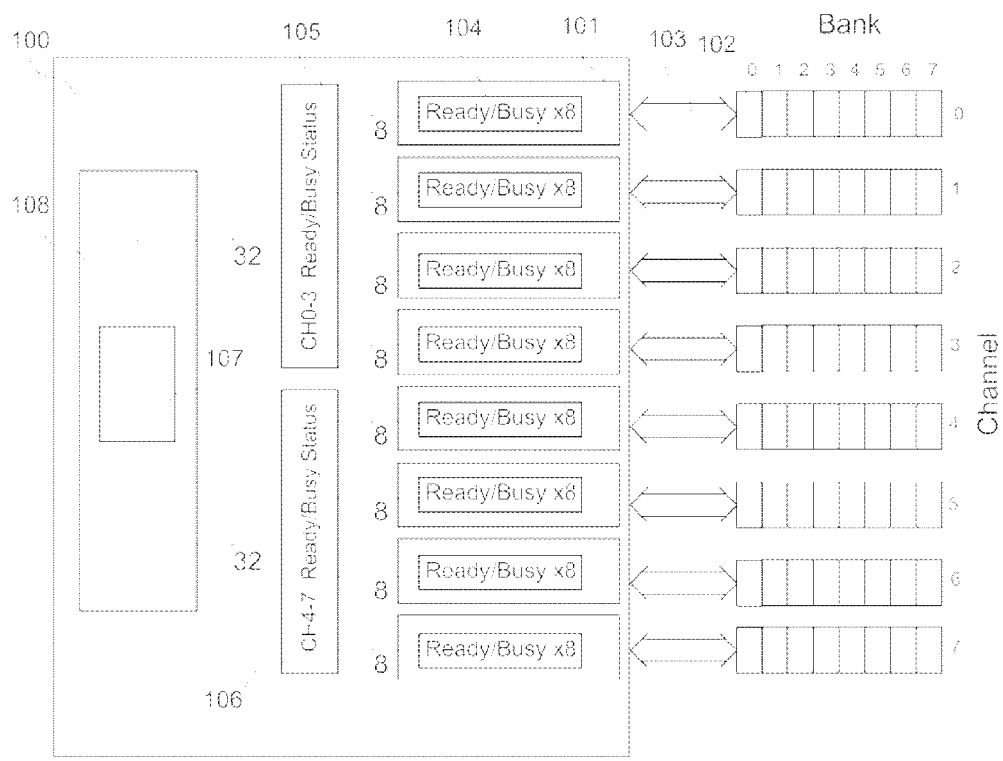
FIG. 1 shows a schematic of components of a conventional nonvolatile memory controller attached to multiple memory bus channels, each with multiple individual banks of memory devices, and the monitoring of a Ready/Busy status of each bank.

A non-volatile memory controller, according to the current state of the art, provides a plurality of memory bus channels, each of which may be attached to a plurality of individual memory device banks. Referring to FIG. 1, a non-volatile memory controller 100, is shown as attached via eight memory channels 103, which in turn are connected to eight memory banks 102. Each memory channel 103 is shown as connected to a channel controller 101, which contains a state machine 104 that maintains a Ready/Busy status of the eight memory banks 102 attached to that channel 103. The status bits of the various channels 103 may be combined into one of more registers, such as 32-bit registers 105 and 106, for more convenient reading in one operation by a polling loop 107 contained within firmware 108 of the controller 100.

Figure 2:
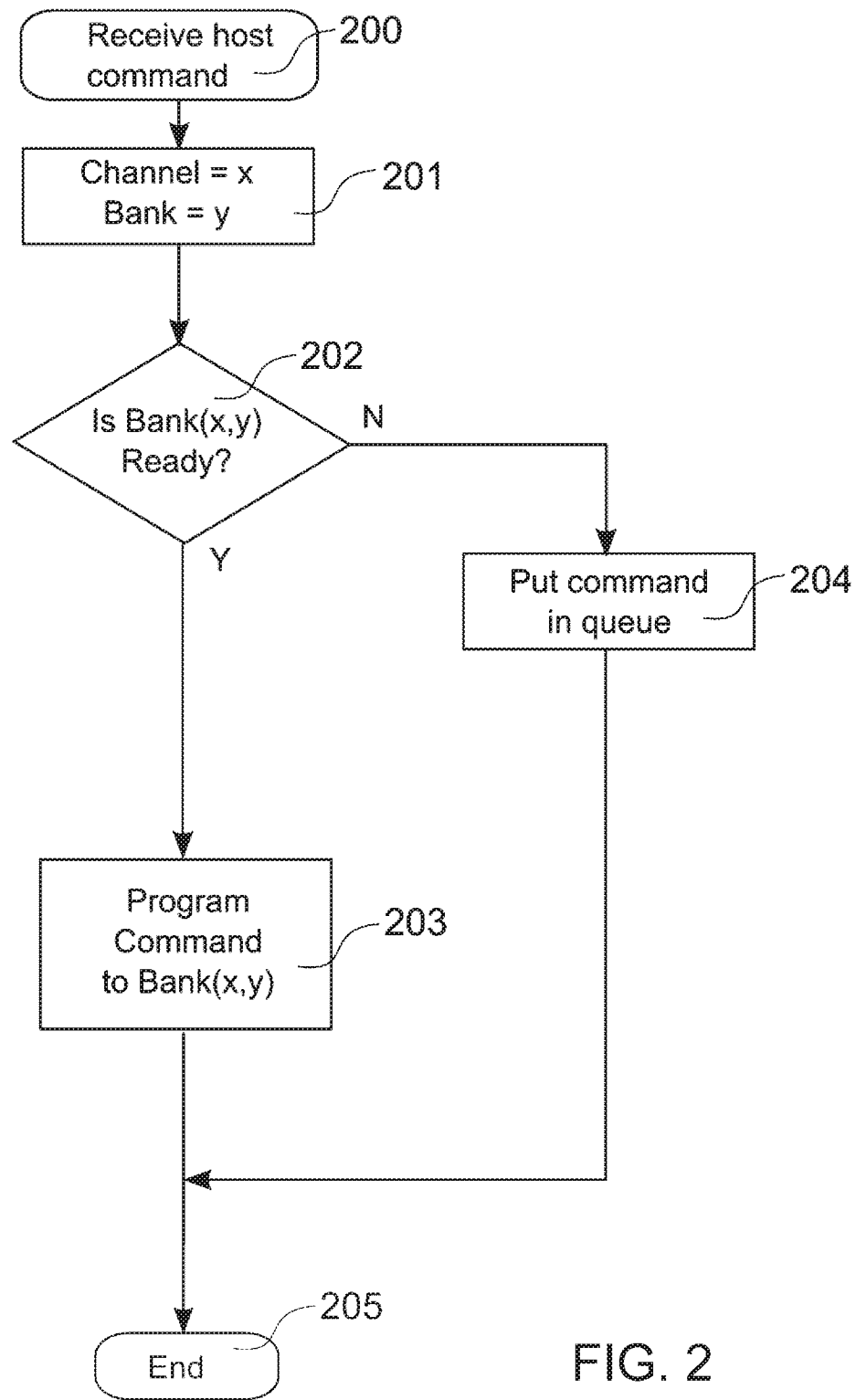
FIG. 2 shows a flow chart of a command processing routine of a conventional non-volatile controller attached to multiple memory bus channels each with multiple individual banks of memory devices.

As shown in the flow chart of FIG. 2, when commands such as those for reading and writing of data are received from a host system to be sent to a memory array 200, they will be translated into commands assigned to a specific memory bank, identified by the channel number (x) and bank number (y) 201 and sent to the appropriate channel controller. If memory bank (x,y) is Ready 202, the command can be programmed directly to Bank (x,y) 203. If Bank (x,y) is busy, the command is placed in a queue 204. The command processing then ends 205.

Figure 3:
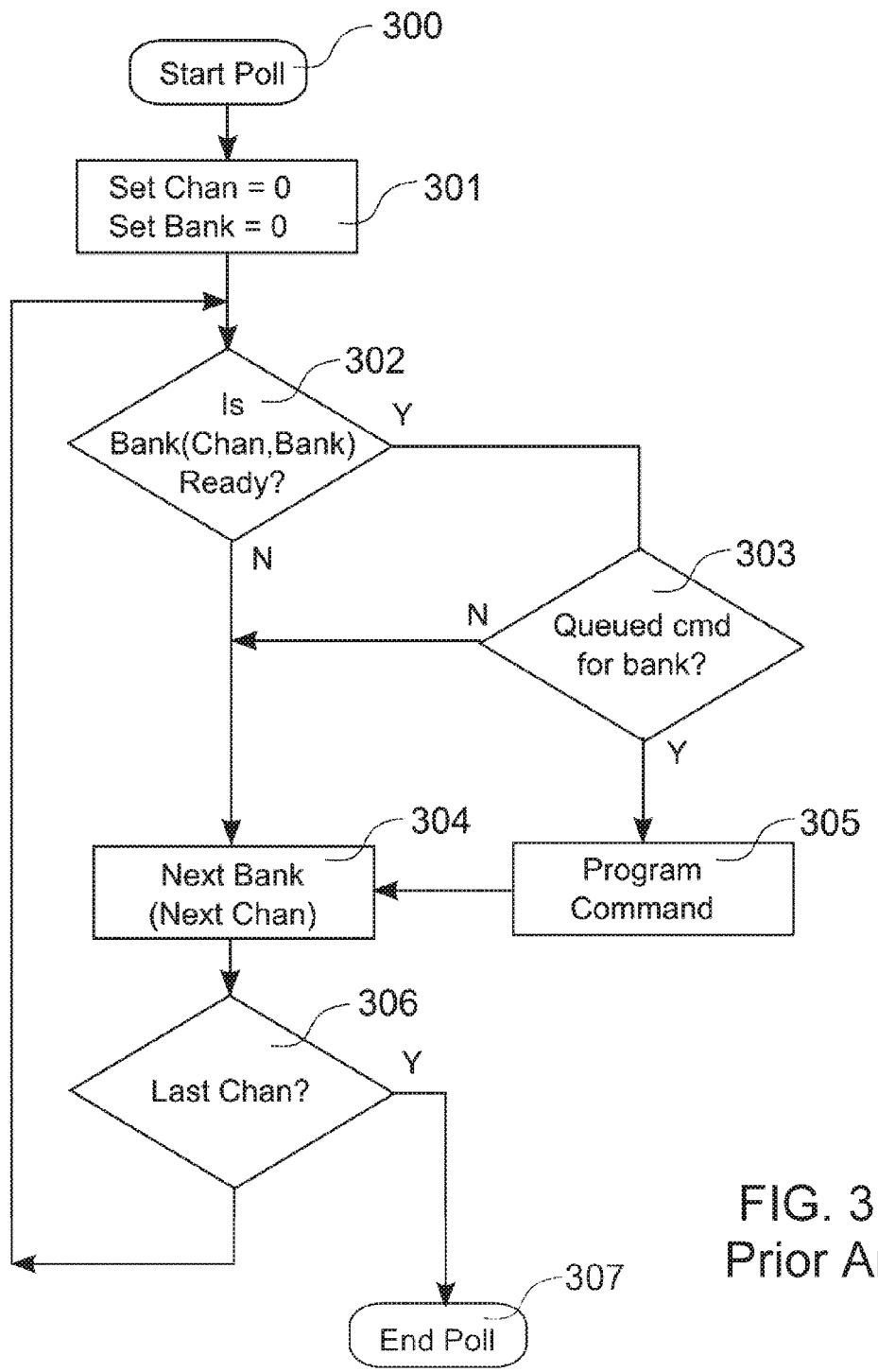
FIG. 3 shows a flow chart of a command processing routine of a conventional non-volatile controller attached to multiple memory bus channels, each with multiple individual banks of memory devices, where additional checking is done to see if a command is queued.

To process queued commands, a polling loop is often used, as shown in the flow chart of FIG. 3. The loop starts 300 and initializes the memory channel and memory bank indices Chan and Bank 301. Each memory bank is tested to see if Ready status is set 302 and if not the Chan and Bank indices are incremented 304 then a test is made to see if all the memory banks have been tested 306 and the loop either ends 307 or continues to test the next bank for Ready status 302. If the memory bank was ready at 302, a test is made to see if a command is queued for that bank 303 and if so the command is programmed to that bank 305 and the loop continues by selecting the next bank 304.

Such a loop is inefficient as it tests all the banks that are ready to see if they have a command queued. In general, there will be fewer banks with queued commands than the number of banks that are ready, so that some tests for the bank being ready are wasted as there is no command queued for that bank.

Figure 4A:
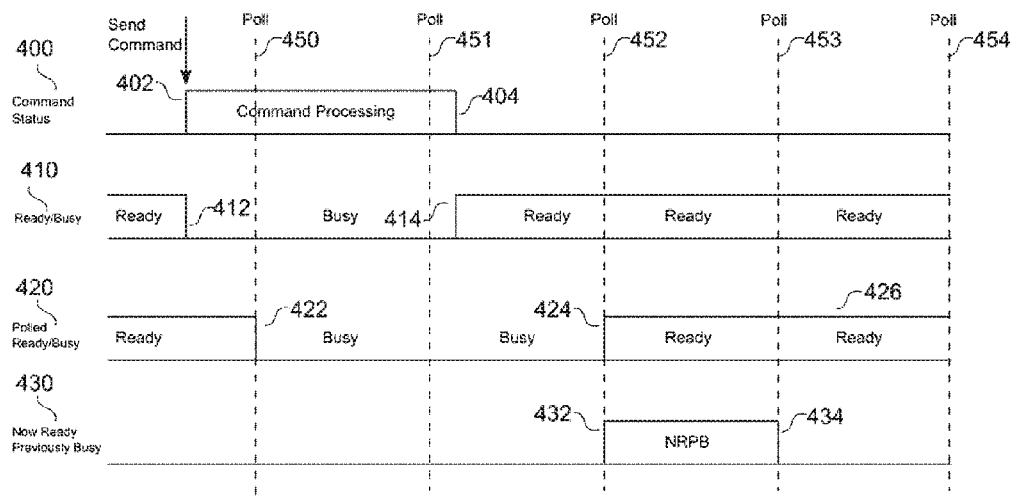
FIG. 4a shows a timing diagram with Ready/Busy status signals while processing a first command sent in a first polling interval and no other commands sent in a subsequent polling intervals according to an aspect of the present invention.
Figure 4B:
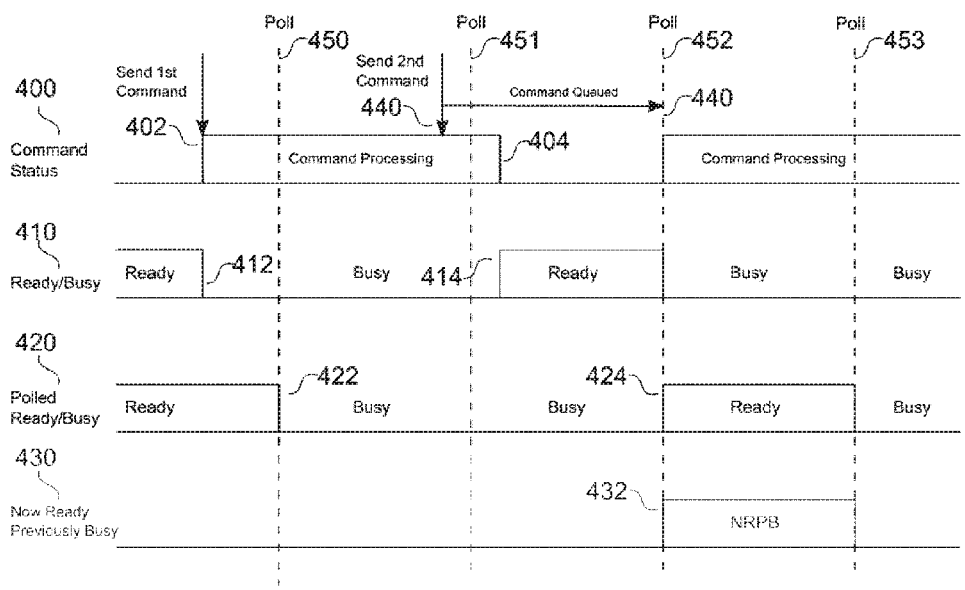
FIG. 4b shows a timing diagram with Ready/Busy status signals while processing a first command sent in a first polling interval and a second command sent in a second polling interval which results in the second command being queued according to an aspect of the present invention.
Figure 5:
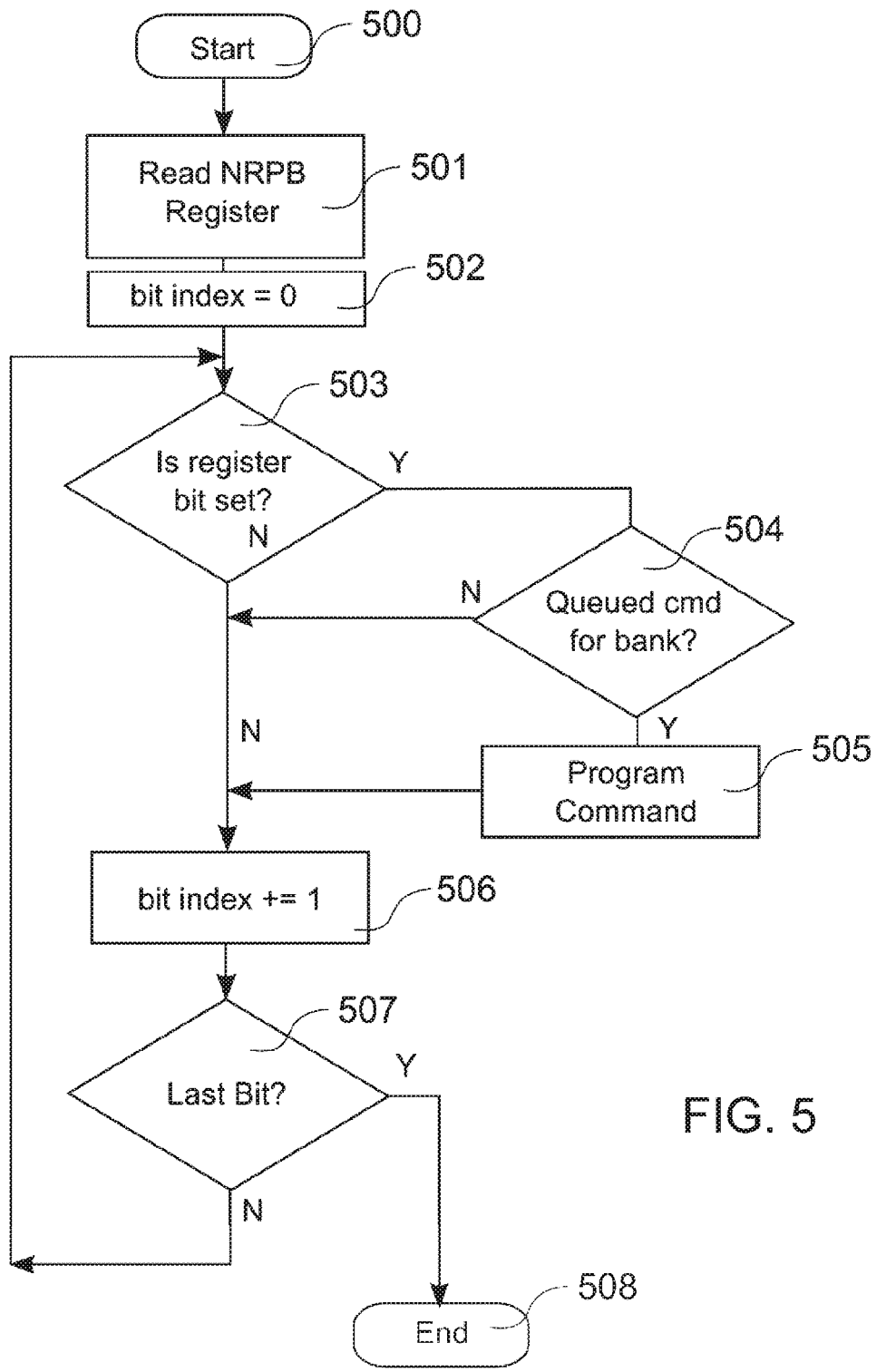
FIG. 5 shows a flow chart of a polling loop routine to process queued commands in an accelerated manner for a controller attached to multiple memory bus channels each with multiple individual banks of memory devices according to an aspect of the present invention.

FIGS. 4a, 4b, and 5 represent methods in accordance with preferred but nonlimiting aspects of the present invention. These methods may be implemented with a memory controller similar to the one represented in FIG. 1; however, it is foreseeable that implementing portions of the hereinafter described methods with specifically tailored hardware components may be more efficient. Referring to FIG. 4a, the command status 400 enters the command processing state after a command is received 402 and then reverts to idle as the processing finishes 404. The memory bank's Ready/Busy status 410 reflects this as the memory device becomes Busy 412 at the same time as the command processing begins 402 and becomes Ready 414 as the command processing ends 404. The channel controller polls this status of the memory bank at intervals, 450-454, to provide the polled Ready/Busy status 420 which becomes Busy 422 at the next polling event 450 after the command processing begins 402 and becomes Ready again 424 at the next polling event 452 after the command processing ends 404.

FIG. 4a illustrates the case where a single command arrives and completes with no command arriving in the intervening time. When the command arrives the current polled status 420 is ready and command is sent 402 and starts processing immediately. At the next polling point 450, the status becomes busy 422 and remains busy until the end of the polling interval during which the command completes processing, at which point it becomes ready 424.

In FIG. 4b, a second command 440 is shown arriving while the first command is processing. Since the polled Ready/Busy state 420 is Busy, the command is queued 440. At the next polling point 451, the Ready/Busy state is still busy and so the command continues to be queued. Only when the first command finishes processing 404 and the memory bank's Ready/Busy status becomes Ready 414 and then becomes polled at the next interval 452 such that the polled Ready/Busy status becomes Ready 424, can the second command be programmed to the bank and start processing 444.

FIG. 4b shows that a command will be queued if the status is busy, corresponding to a previous command processing. Therefore, the only time a command which is queued needs servicing is when the previous command ends, which results in the status going from busy to ready. It follows that only when the previous status was busy and the current status is ready is there a need to service a queued command.

In FIGS. 4a and 4b, a status signal which indicates "Now Ready, Previously Busy" (NRPB) 430 becomes true at 432 and becomes false at 434. The polled ready/Busy status also becomes true (ready) at 424 but remains true at 426 and remains so until a succeeding command is processed. Therefore, checking for NRPB being true can avoid having to check during the interval 426 and succeeding intervals, as a prior art check for Ready/Busy being true would involve.

FIG. 5 shows a flow chart of the processing loop using a 'Now Ready, Previously Busy' (NRPB) register which has one bit assigned to each memory bank in the system. Each bit indicates if the bank it represents has changed from busy (0) to ready (1) since the last time the Ready/Busy status of the bank was polled. The loop starts 500 and reads the NRPB register 501. A bit index is set to zero 502, where the bit index is used to represent a memory bank on a channel, then each memory bank is tested to see if Ready status is set by testing if the NRPB register bit referenced by the bit index is set 503 and if not the bit index is incremented 506. A test is then made to see if this is the last bit index and all the banks have been tested 507 and the loop either ends 508 or continues to test the next bit index 503. If the register bit was set at 503 (meaning the corresponding memory bank was ready), a test is made to see if a command is queued for that bank 504 and if so the command is programmed to that bank 505 and the loop continues by selecting the next bank by incrementing the bit index 506.

The "Now Ready, Previously Busy" (NRPB) 430 status of the memory bank may be determined by the channel controller and will be referred to hereinafter as a derived status of the memory bank. The derived status of each memory bank corresponding to a channel may be maintained in the state machine of the corresponding channel controller. As such, the state machine stores a derived status of each memory bank, which is updated either automatically by hardware, for example, when the physical pin changes state, or on instruction from software on each polling event. The state machine may further change the derived status upon other events such as a new command being sent to the memory device, data being received from the memory device, etc. The derived statuses of each state machine may further be stored in a hardware register or status register. Such an arrangement may be more efficient as it allows software to obtain the derived statuses of all the memory banks from one or more status registers rather than having to communicate with all of the channel controllers individually. Consequently, the derived status of a memory bank is preferably read from a status register during the polling loop. The precise number of bits, status registers, and/or status register width will depend on the number of channels, number of banks on each channel, and the processing capabilities of the memory controller.

Figure 6:
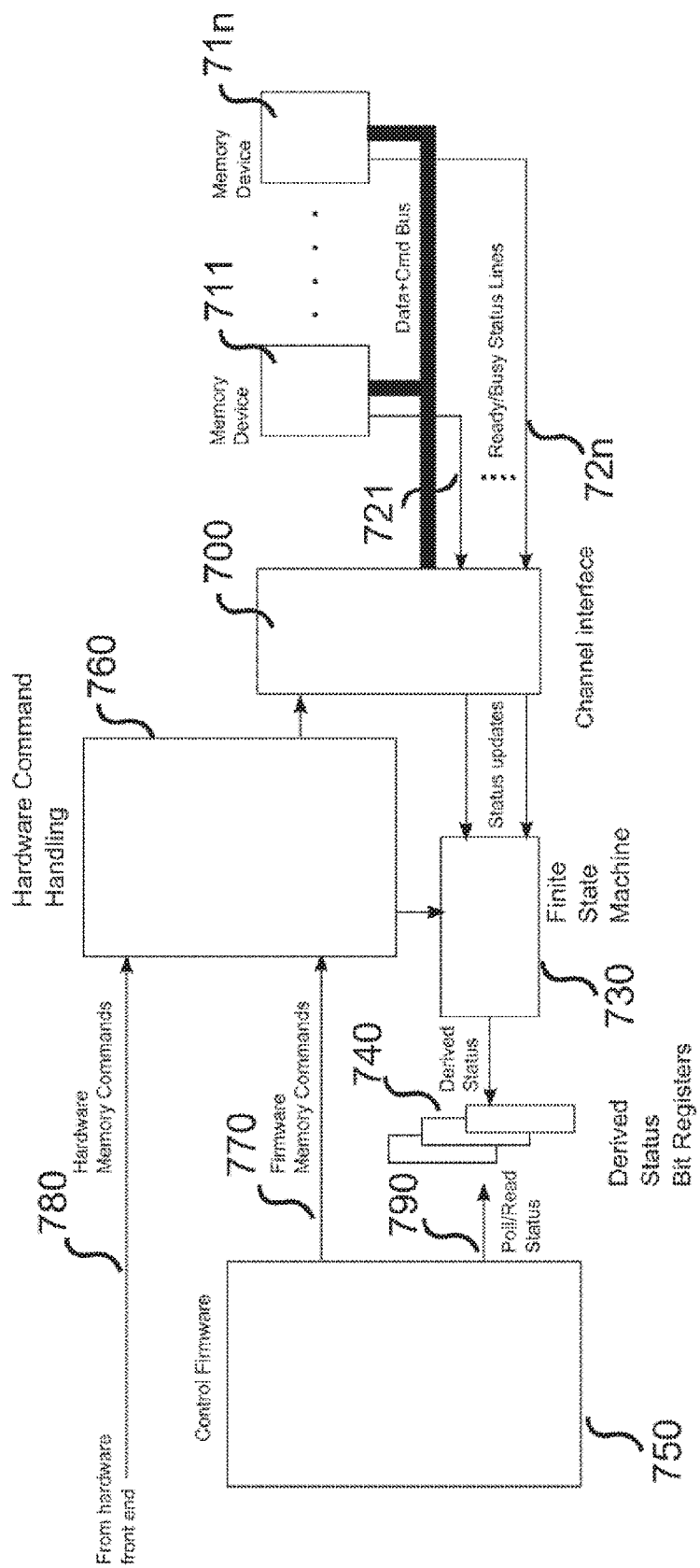
FIG. 6 shows an overall schematic of components that can be involved in handling of a ready status from memory devices through the memory channel controller to the controller firmware according to an aspect of the present invention.

FIG. 6 represents one possible implementation of a process as described above. In FIG. 6, a channel interface 700 of a memory controller provides a hardware bus interface to memory devices (banks) on a channel, memory device 711 to memory device 71n. Each memory device may also be connected by a Ready/Busy status line, 721 to 72n, to the channel interface 700. In a typical memory controller, there may be a number of separate channel interfaces (not shown), each with an identical arrangement and connections to memory devices. The channel interface 700 provides updates of the memory status to a finite state machine 730, which combines current and previous statuses to form a derived status which is passed to derived status bit registers 740. Firmware 750 of the memory controller may issue memory commands 770 to a hardware command handling component 760, which also handles direct memory commands 780 from a hardware front end. The firmware memory commands 770 may include status command requests to memory devices as an alternative arrangement to obtaining the ready/busy status via dedicated status lines 721 to 72n. Regardless of the arrangement adopted, the derived status 740 may be polled or read 790 by the firmware 750.

While the invention has been described in terms of specific embodiments, it is apparent that other forms could be adopted by one skilled in the art. For example functionally equivalent memory technology may supersede the PCM, RRAM, MRAM, FeRAM and NAND flash memory taught in this disclosure. In addition, the assembly could differ in appearance and construction from the embodiments shown in the Figures, the functions of each component of the device could be performed by components of different construction but capable of a similar (though not necessarily equivalent) function, processing parameters such as time intervals and durations could be modified. Therefore, the scope of the invention is to be limited only by the following claims.

The invention claimed is:

1. A mass storage device comprising:
   one or more memory bus channels, each memory bus channel connected to a channel controller;
   a memory controller connected via the channel controller to the one or more memory bus channels; and
   a plurality of non-volatile memory devices connected to the one or more memory bus channels,
   wherein the channel controller is configured to:
      at a first time, poll a first status of one or more of the plurality of non-volatile memory devices,
      at a second time after the first time, poll a second status of the one or more of the plurality of non-volatile memory devices, the first status and the second status each indicating whether the one or more non-volatile memory devices can accept a data command from a command queue, and
      determine a combined status by performing a logical operation using the first status and the second status, the combined status indicating whether a check of the command queue is needed, and
   wherein the memory controller is configured to perform a check of the command queue according to the combined status as determined by the logical operation.

2. The mass storage device of claim 1, wherein the command queue is checked when (i) the first polled status data is a busy status indicating that the one or more non-volatile memory devices cannot accept the data command and (ii) the second polled status data is a ready status indicating that the one or more non-volatile memory devices can accept the data command.

3. The mass storage device of claim 1, further comprising:
   one or more status registers storing the combined status of the one or more of the plurality of non-volatile memory devices.

4. The mass storage device of claim 3, wherein the memory controller is configured to poll the one or more status registers storing the combined status of the one or more of the plurality of non-volatile memory devices.

5. The mass storage device of claim 1, wherein the memory controller is further configured to issue the data command in the command queue based on the combined status.

6. The mass storage device of claim 1, wherein the channel controller comprises a state machine configured to store the first status and the second status of the one or more of the plurality of nonvolatile memory devices and to determine the combined status.

7. The mass storage device of claim 6, wherein the channel controller updates one or more status registers storing the combined status of the one or more of the plurality of non-volatile memory devices.

8. The mass storage device of claim 1, wherein the plurality of nonvolatile memory devices are NAND flash memory devices.

9. The mass storage device of claim 1, wherein the plurality of nonvolatile memory devices are phase change memory devices.

10. The mass storage device of claim 1, wherein the plurality of nonvolatile memory devices are magneto-resistive memory devices.

11. A method of queuing a data command for one or more of a plurality of non-volatile memory devices of a mass storage device, the method comprising:
    at a first time, polling a first status of the one or more of the plurality of non-volatile memory devices;
    at a second time after the first time, polling a second status of the one or more of the plurality of non-volatile memory devices, the first status and the second status each indicating whether the one or more non-volatile memory devices can accept a data command from a command queue;
    determining a combined status by performing a logical operation using the first status and the second status, the combined status indicating whether a check of the command queue is needed; and
    checking the command queue according to the combined status as determined by the logical operation.

12. The method of claim 11, further comprising:
    storing the combined status in one or more status registers.

13. The method of claim 12, further comprising:
    polling the combined status with a memory controller connected to the one or more status registers,
    wherein the memory controller issues the data command in the command queue for the one or more of the plurality of non-volatile memory devices based on the combined status.

14. The method of claim 13, further comprising:
    updating the combined status in the one or more status registers.

15. The method of claim 11, further comprising:
    storing the status data of the one or more of the plurality of non-volatile memory devices in a state machine.

16. The method of claim 11, wherein the plurality of non-volatile memory devices are NAND flash memory devices.

17. The method of claim 11, wherein the plurality of non-volatile memory devices are phase change memory devices.

18. The method of claim 11, wherein the plurality of non-volatile memory devices are magneto-resistive memory devices.

19. The mass storage device of claim 1, wherein the combined status is represented by a single bit.

20. The mass storage device of claim 1, wherein the combined status is determined in a first instance after the second status is polled at the second time.

21. The method of claim 11, further comprising:
checking the command queue when (1) the first polled status is a busy status indicating that the one or more of the plurality of non-volatile memory devices cannot accept the data command and (ii) the second polled status is a ready status indicating that the one or more of the plurality of non-volatile memory devices can accept the data command.

22. The method of claim 11, wherein the combined status is represented by a single bit.

23. The method of claim 11, wherein the combined status is determined in a first instance after the second status is polled at the second time.

* * * * *